US012640204B2

(12) United States Patent
Jeong et al.

(10) Patent No.: US 12,640,204 B2
(45) Date of Patent: May 26, 2026

(54) MEMORY DEVICE

(71) Applicant: SK hynix Inc., Icheon-si (KR)

(72) Inventors: Chan Hui Jeong, Icheon-si (KR);
Hyung Jin Choi, Icheon-si (KR)

(73) Assignee: SK hynix Inc., Icheon-si (KR)

( * ) Notice: Subject to any disclaimer, the term of this
patent is extended or adjusted under 35
U.S.C. 154(b) by 212 days.

(21) Appl. No.: 18/478,710

(22) Filed: Sep. 29, 2023

(65) Prior Publication Data

US 2024/0386964 A1 Nov. 21, 2024

(30) Foreign Application Priority Data

May 18, 2023 (KR) ........................ 10-2023-0064511

(51) Int. Cl.
*G11C 16/10* (2006.01)
*G11C 7/04* (2006.01)
*G11C 16/24* (2006.01)
*G11C 16/26* (2006.01)

(52) U.S. Cl.
CPC .............. *G11C 16/102* (2013.01); *G11C 7/04*
(2013.01); *G11C 16/24* (2013.01); *G11C 16/26*
(2013.01)

(58) Field of Classification Search
CPC ... G11C 7/04; G11C 11/406; G11C 11/40626;
G11C 5/147; G11C 5/143
USPC .................................................. 365/211, 203
See application file for complete search history.

(56) References Cited

U.S. PATENT DOCUMENTS

| | | | |
|---|---|---|---|
| 2012/0099391 A1* | 4/2012 | Park ...................... G11C 16/26 365/203 |
| 2016/0293252 A1 | 10/2016 | Ogiwara et al. |
| 2021/0050054 A1 | 2/2021 | Ray et al. |
| 2021/0217456 A1* | 7/2021 | Choi ...................... G11C 5/145 |

* cited by examiner

*Primary Examiner* — Richard Elms
(74) *Attorney, Agent, or Firm* — William Park &
Associates Ltd.

(57) ABSTRACT

A memory device includes a control signal generation circuit
configured to generate a control signal at a voltage level
corresponding to a current temperature in each operation
period, among a plurality of operation periods, of a program
operation, and a bit line control circuit configured to charge
a bit line in response to the control signal.

23 Claims, 7 Drawing Sheets

FIG. 2

| OPERATION PERIOD | TS | CTL |
|---|---|---|
| T1 | 101 | H1 |
| T2, T4 | 011 | H2 |
| T3 | 110 | H3 |
| - | 111 | RL |
| - | 100 | - |

FIG. 8A

| TEMPERATURE (℃) | -30 | -10 | 10 | 30 | 50 | 70 | 90 |
|---|---|---|---|---|---|---|---|
| RV | 30 | 30 | 30 | 30 | 30 | 30 | 30 |
| BLS | 30 | 30 | 30 | 30 | 30 | 30 | 30 |
| RL (V) | 1.280 | 1.252 | 1.224 | 1.196 | 1.168 | 1.140 | 1.112 |

FIG. 8B

| TEMPERATURE (℃) | -30 | -10 | 10 | 30 | 50 | 70 | 90 |
|---|---|---|---|---|---|---|---|
| RV | 34 | 34 | 34 | 34 | 34 | 34 | 34 |
| TC1 | 8 | 7 | 6 | 5 | 4 | 3 | 2 |
| BLS | 26 | 27 | 28 | 29 | 30 | 31 | 32 |
| H1 (V) | 1.240 | 1.222 | 1.204 | 1.186 | 1.168 | 1.150 | 1.132 |

FIG. 8C

| TEMPERATURE (℃) | -30 | -10 | 10 | 30 | 50 | 70 | 90 |
|---|---|---|---|---|---|---|---|
| RV | 33 | 33 | 33 | 33 | 33 | 33 | 33 |
| TC2 | 5 | 5 | 5 | 5 | 4 | 3 | 2 |
| BLS | 28 | 28 | 28 | 28 | 29 | 30 | 31 |
| H2 (V) | 1.260 | 1.232 | 1.204 | 1.176 | 1.158 | 1.140 | 1.122 |

FIG. 8D

| TEMPERATURE (℃) | -30 | -10 | 10 | 30 | 50 | 70 | 90 |
|---|---|---|---|---|---|---|---|
| RV | 28 | 28 | 28 | 28 | 28 | 28 | 28 |
| TC1 | 8 | 7 | 6 | 5 | 4 | 3 | 2 |
| BLS | 36 | 35 | 34 | 33 | 32 | 31 | 30 |
| H3 (V) | 1.340 | 1.302 | 1.264 | 1.226 | 1.188 | 1.150 | 1.112 |

MEMORY DEVICE

CROSS-REFERENCES TO RELATED APPLICATION

The present application claims priority under 35 U.S.C. § 119(a) to Korean application number 10-2023-0064511, filed on May 18, 2023, which is incorporated herein by reference in its entirety.

BACKGROUND

1. Technical Field

The present technology relates to a memory device.

2. Related Art

A volatile memory device is a memory device in which data stored therein is lost when power supply is cut off. A non-volatile memory device is a memory device in which data stored therein is retained even when power supply is cut off. Electronic elements included in a memory device may operate with different performance depending on temperatures. Accordingly, a temperature compensation technique may be required to maintain constant performance of the memory device regardless of the temperature.

SUMMARY

A memory device according to an embodiment of the present technology may include: a control signal generation circuit configured to generate a control signal at a voltage level corresponding to a current temperature in each operation period, among a plurality of operation periods, of a program operation; and a bit line control circuit configured to charge a bit line in response to the control signal.

A memory device according to an embodiment of the present technology may include: a control signal generation circuit configured to generate a bit line level signal, which corresponds to a voltage level of a bit line, based on first and second temperature compensation values in response to an operation period signal and configured to generate a control signal based on the bit line level signal and a third temperature compensation value; and a bit line control circuit configured to charge the bit line in response to the control signal.

A memory device according to an embodiment of the present technology may include: a control signal generation circuit configured to generate a control signal in a period in which a bit line is charged before a verification voltage is applied to a word line during a program operation, wherein variations in temperature of a level of the control signal at a temperature lower than a maximum peak current temperature are greater than variations in temperature of the level of the control signal at a temperature higher than the maximum peak current temperature; and a bit line control circuit configured to charge the bit line in response to the control signal.

BRIEF DESCRIPTION OF THE DRAWINGS

FIG. 2 is a circuit diagram illustrating a memory block, according to an embodiment of the present technology.

FIGS. 8A to 8D are tables exemplarily illustrating a bit line level signal and a reference level and first to third levels of a control signal generated based on a reference value, a first temperature compensation value, and a second temperature compensation value corresponding to a current temperature in the control signal generation circuit of FIG. 7.

DETAILED DESCRIPTION

Hereinafter, embodiments of the present technology will be described in more detail with reference to the accompanying drawings.

Figure 1:
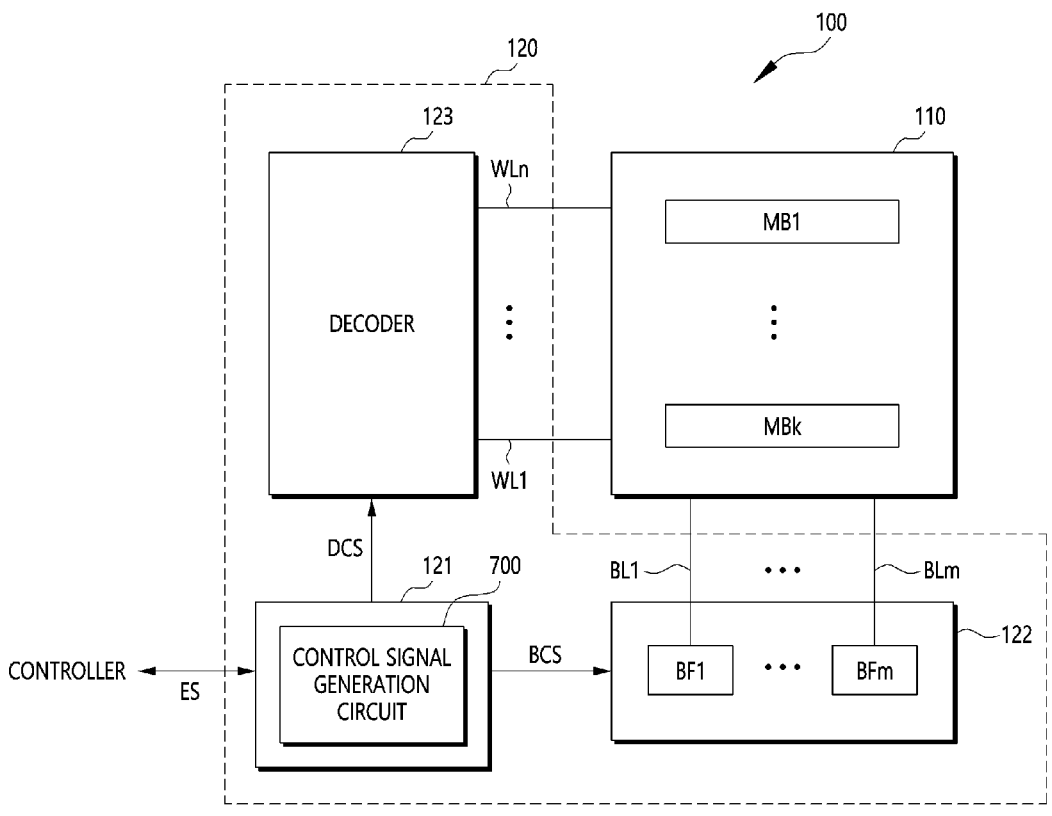
FIG. 1 is a block diagram illustrating a memory device, according to an embodiment of the present technology.

FIG. 1 is a block diagram illustrating a memory device 100, according to an embodiment of the present technology.

Referring to FIG. 1, the memory device 100 may operate under the control of an external device, for example, a controller. Operations of the memory device 100 may include a read operation, a program operation, and an erase operation.

The memory device 100 may include various types of memory, such as NAND flash memory, 3D NAND flash memory, NOR flash memory, resistive random access memory (RRAM), phase change memory (PRAM), magnetoresistive random access memory (MRAM), ferroelectric random access memory (FRAM), and spin transfer torque random access memory (STT-RAM).

The memory device 100 may include a memory cell array 110 and a peripheral circuit 120.

The memory cell array 110 may include a plurality of memory blocks MB1 to MBk. A memory block may be a unit in which the memory device 100 performs the erase operation. That is, data stored in the memory block may be simultaneously erased. Each of the memory blocks MB1 to MBk may include a plurality of memory cells in which data are stored. The memory cells may be arranged to be parallel to a substrate in a two-dimensional structure or may be arranged to be vertically stacked from the substrate in a three-dimensional structure.

The peripheral circuit 120 may perform the program operation, the read operation, and the erase operation on the memory cell array 110 under the control of the controller. The peripheral circuit 120 may receive external signals ES including commands, addresses, and data from the controller and may perform internal operations of the memory device 100 in response to the external signals ES.

The peripheral circuit 120 may include a control circuit 121, a buffer group 122, and a decoder 123.

The control circuit 121 may control overall operations of the memory device 100 according to the external signals ES received from the controller. The control circuit 121 may generate buffer control signals BCS based on the external signals ES and may output the buffer control signals BCS to the buffer group 122. The control circuit 121 may generate decoder control signals DCS based on the external signals ES and may output the decoder control signals DCS to the decoder 123. For example, the decoder control signals DCS may include program voltages and verification voltages having various levels, which are necessary for the program operation. Although not illustrated, the control circuit 121 may include an interface that communicates with the controller, and a voltage generation circuit that generates voltages having various levels.

The control circuit 121 may include a control signal generation circuit 700. The control signal generation circuit 700 may generate a control signal at a voltage level corresponding to a current temperature in each operation period of the program operation. The control signal may be a signal that charges a bit line.

Specifically, the control signal generation circuit 700 may generate the control signal at a first level in a first operation period, among the operation periods. The first level may be lower than a reference level at a first reference temperature and may be higher than the reference level at a second reference temperature that is higher than the first reference temperature. The reference level may have negative variations in temperature. In other words, as the temperature increases, the reference level may decrease. The reference level may be a voltage level of the control signal for charging the bit line to a constant voltage level regardless of the current temperature. The first operation period may include a period in which the bit line is charged with a weak program allowable voltage before a program voltage is applied to a word line.

The control signal generation circuit 700 may generate the control signal at a second level in a second operation period, among the operation periods. The second level may be lower than the reference level having negative variations in temperature at the first reference temperature and may be higher than the reference level at the second reference temperature that is higher than the first reference temperature. The control signal at the second level may have greater variations in temperature at a temperature lower than the maximum peak current temperature than at a temperature higher than the maximum peak current temperature. At the temperature lower than the maximum peak current temperature, the variations in temperature of the control signal at the second level may be equal to the variations in temperature of the control signal at the reference level. The second operation period may include a period in which the bit line is weakly charged before a state of the bit line (i.e., a voltage level of the bit line or a current in the bit line) is sensed.

The control signal generation circuit 700 may generate the control signal at a third level in a third operation period, among the operation periods. The third level may be higher than the reference level having negative variations in temperature at the first reference temperature and may be equal to the reference level at the second reference temperature that is higher than the first reference temperature. The third operation period may include a period in which the bit line is strongly charged and then the state of the bit line, which is changed based on a state of the memory cell in response to the verification voltage, is sensed.

The control signal generation circuit 700 may generate the control signal at the second level in a fourth operation period, among the operation periods. The fourth operation period may include a period in which the bit line is weakly charged before the state of the bit line is additionally sensed based on an additional verification voltage.

According to an embodiment, the control signal generation circuit 700 may generate a bit line level signal corresponding to the voltage level of the bit line based on the first and second temperature compensation values in response to an operation period signal and may generate the control signal based on the bit line level signal and a third temperature compensation value.

Specifically, in response to the operation period signal corresponding to the first operation period, the control signal generation circuit 700 may subtract the first temperature compensation value from the reference value to generate a value as the bit line level signal. In response to the operation period signal corresponding to the second operation period, the control signal generation circuit 700 may subtract the second temperature compensation value from the reference value to generate a value as the bit line level signal. The control signal generation circuit 700 may determine a first voltage level based on the bit line level signal and may output the control signal at the second voltage level obtained by adding the third temperature compensation value to the first voltage level. The first voltage level may be the voltage level of the control signal capable of charging the bit line to a voltage level corresponding to the bit line level signal.

The first temperature compensation value may be determined based on program characteristics and current characteristics of the memory cells with respect to temperatures. The first temperature compensation value may have negative variations in temperature.

The second temperature compensation value may be determined based on peak current characteristics with respect to temperatures and bit line settling time. The second temperature compensation value may be a constant value at the temperature lower than the maximum peak current temperature and may have negative variations in temperature at the temperature higher than the maximum peak current temperature.

The third temperature compensation value may be determined based on threshold voltage characteristics with respect to temperatures of a control transistor to which the control signal is applied. The third temperature compensation value may have negative variations in temperature.

The buffer group 122 may be connected to the memory cell array 110 through bit lines BL1 to BLm. The buffer group 122 may include a plurality of bit line control circuits BF1 to BFm respectively connected to the bit lines BL1 to BLm. When the program operation is performed, the plurality of bit line control circuits BF1 to BFm may temporarily store program data to be stored in the memory cells. The plurality of bit line control circuits BF1 to BFm may simultaneously operate in response to the buffer control signals BCS, and thus, the program operation may be simultaneously performed on the memory cells. Each of the bit line control circuits BF1 to BFm may charge the corresponding bit line in response to the corresponding control signal. In response to the corresponding control signal, each of the bit line control circuits BF1 to BFm may charge the corresponding bit line to a voltage level determined according to the voltage level of the corresponding control signal.

The decoder 123 may be connected to the memory cell array 110 through word lines WL1 to WLn. Under the control of the control circuit 121, the decoder 123 may select a word line, that is, a selected word line, which is connected to the memory cells on which the program operation is to be performed, from among the word lines WL1 to WLn, and may apply the program voltages and verification voltages having various levels to the selected word line.

Figure 2:
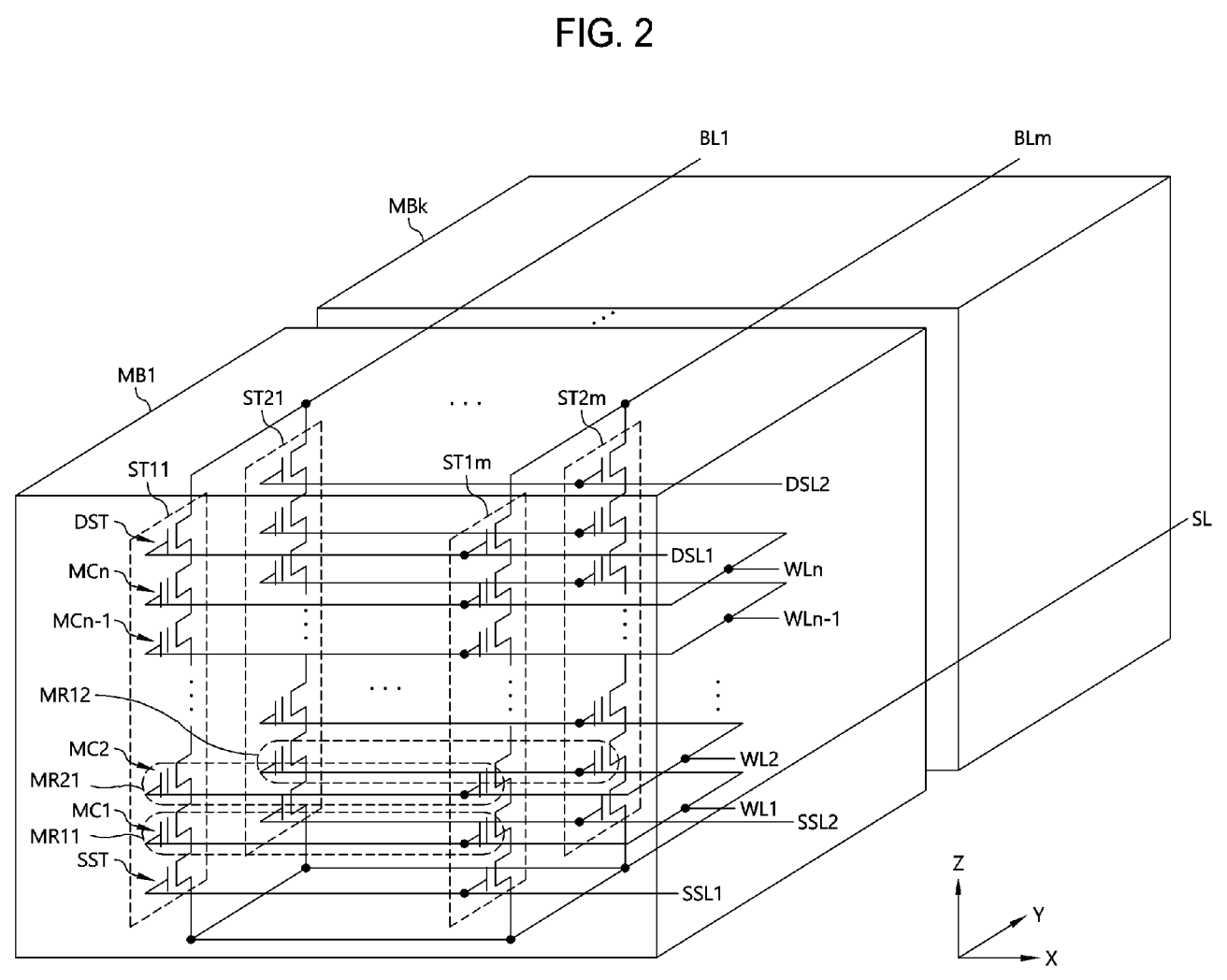

FIG. 2 is a circuit diagram illustrating the memory block MB1, according to an embodiment of the present technology. Each of the memory blocks MB1 to MBk included in the memory device 100 may be configured similarly to the memory block MB1 of FIG. 2.

Referring to FIG. 2, the memory block MB1 may include strings ST11 to ST1m and ST21 to ST2m. Each of the strings ST11 to ST1m and ST21 to ST2m may extend in a vertical direction, i.e., a Z direction. Within the memory block MB1, m strings may be arranged in a row direction, i.e., an X direction. Although FIG. 2 illustrates that two strings are arranged in a column direction, i.e., a Y direction, this for convenience in description, and three or more strings may be arranged in the column direction, i.e., the Y direction.

The strings ST11 to ST1m and ST21 to ST2m may have the same configuration. For example, the string ST11 may include a source selection transistor SST, memory cells MC1 to MCn, and a drain selection transistor DST, which are connected in series to one another between a source line SL and a bit line BL1. A source of the source selection transistor SST may be connected to the source line SL, and a drain of the drain selection transistor DST may be connected to the bit line BL1. The memory cells MC1 to MCn may be connected in series to one another between the source selection transistor SST and the drain selection transistor DST.

Gates of source selection transistors of strings arranged in the same row may be connected to the same source selection line. For example, gates of the source selection transistors of the strings ST11 to ST1m arranged in a first row may be connected to a source selection line SSL1. For example, gates of the source selection transistors of the strings ST21 to ST2m arranged in a second row may be connected to a source selection line SSL2. According to another embodiment, the source selection transistors of the strings ST11 to ST1m and ST21 to ST2m may be connected in common to one source selection line.

Gates of drain selection transistors of strings arranged in the same row may be connected to the same drain selection line. For example, gates of the drain selection transistors of the strings ST11 to ST1m arranged in the first row may be connected to a drain selection line DSL1. For example, gates of the drain selection transistors of the strings ST21 to ST2m arranged in the second row may be connected to a drain selection line DSL2.

Strings arranged in the same column may be connected to the same bit line. For example, the strings ST11 and ST21 arranged in a first column may be connected to the bit line BL1. For example, the strings ST1m and ST2m arranged in an $m^{th}$ column may be connected to a bit line BLm.

Gates of memory cells at the same position in the vertical direction may be connected to the same word line. For example, in the strings ST11 to ST1m and ST21 to ST2m, memory cells at the same position in the vertical direction as the memory cell MC1 may be connected to a word line WL1.

Among memory cells, memory cells connected to the same word line in the same row may constitute one memory region. For example, memory cells connected to the word line WL1 in the first row may constitute one memory region MR11. For example, memory cells connected to the word line WL1 in the second row may constitute one memory region MR12. For example, memory cells connected to a word line WL2 in the first row may constitute one memory region MR21. Each word line may be connected to a plurality of memory regions depending on the number of rows. The program operation may be simultaneously performed on memory cells constituting one memory region.

Figure 3:
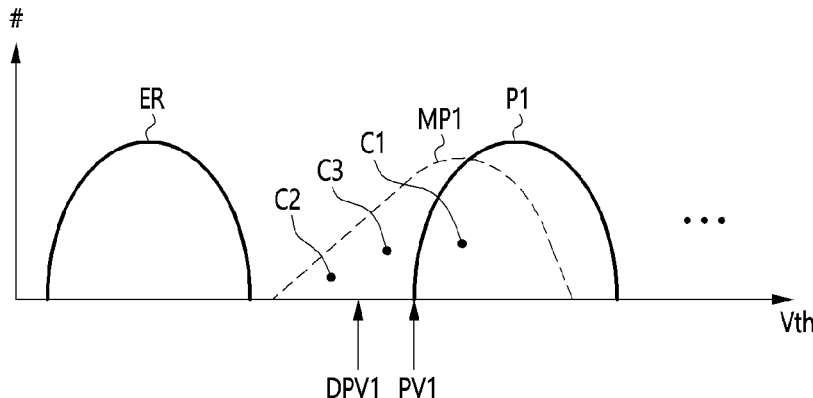
FIG. 3 is a diagram illustrating a program operation, according to an embodiment of the present technology.

FIG. 3 is a diagram illustrating the program operation, according to an embodiment of the present technology. In the graph of FIG. 3, a horizontal axis Vth may represent a threshold voltage, and a vertical axis # may represent the number of memory cells.

Referring to FIG. 3, the program operation may be performed according to an incremental step pulse program (ISPP) method. The program operation may include a plurality of program loops. Program voltages included in each of the plurality of program loops may have levels that increase in a stepwise manner by a predetermined increment. In each of the program loops, a program voltage may be applied to a selected word line to increase a threshold voltage of memory cells, and one or more verification voltages may be applied to the selected word line to check the threshold voltage of the memory cells. Through the application of the verification voltages, among the memory cells, program inhibited memory cells, program allowable memory cells, and weak program allowable memory cells may be determined. Each of the program inhibited memory cells may be a memory cell that should not be affected by the program voltage. In other words, each of the program inhibited memory cells may be a memory cell having a threshold voltage that is to be maintained as it is even though the program voltage is applied to the selected word line. Each of the program allowable memory cells may be a memory cell having a threshold voltage that is to be increased by the program voltage. Each of the weak program allowable memory cells may be a memory cell having threshold voltage that is to be slightly increased, as compared with the threshold voltage of the program allowable memory cells, by the program voltage.

A bit line of the program inhibited memory cell may be charged with a program inhibited voltage. A bit line of the program allowable memory cell may be charged with a program allowable voltage. A bit line of the weak program allowable memory cell may be charged with a weak program allowable voltage. The program inhibited voltage may be higher than the weak program allowable voltage, and the weak program allowable voltage may be higher than the program allowable voltage. For example, the program inhibited voltage may be a predetermined internal voltage. For example, the program allowable voltage may be a ground voltage. When the bit line of the program inhibited memory cell is charged with the program inhibited voltage, the program inhibited memory cell might not be affected by the program voltage. When the bit line of the program allowable memory cell is charged with the program allowable voltage, the threshold voltage of the program allowable memory cell may increase in response to the program voltage. When the bit line of the weak program allowable memory cell is charged with the weak program allowable voltage, the threshold voltage of the weak program allowable memory cell may increase less than an increment in the threshold voltage of the program allowable memory cell in response to the program voltage.

When the program voltage that increases in a stepwise manner is applied to the memory cells several times during the program operation, the threshold voltage of the memory cells may gradually increase. Consequently, the memory cells may be present in a plurality of states through the program operation. Specifically, when each of the memory cells stores x bits, the memory cells may be present in a total of $2^x$ states, that is, an erase state ER and $(2^x)-1$ program states. For example, some memory cells initially in the erase state ER may be in a first program state P1 via an intermediate state MP1 through the program operation.

When the memory cells to be in the first program state P1 are in the intermediate state MP1, a first verification voltage PV1 may be applied to the selected word line. The memory cells may be turned on or off in response to the first verification voltage PV1, and therefore, a state of the bit line charged to a predetermined voltage level may be selectively changed. In addition, a double verification voltage DPV1 may be applied to the selected word line. The memory cells may be turned on or off in response to the double verification voltage DPV1, and therefore, the state of the bit line charged to the predetermined voltage level may be selectively changed. Accordingly, the states of the memory cells may be determined according to the changed voltage level of the bit line.

For example, a memory cell C1 having a threshold voltage higher than the first verification voltage PV1 may be determined as the program inhibited memory cell. A memory cell C2 having a threshold voltage lower than the double verification voltage DPV1 may be determined as the program allowable memory cell. A memory cell C3 having a threshold voltage higher than the double verification voltage DPV1 and lower than the first verification voltage PV1 may be determined as the weak program allowable memory cell.

When the bit line of the memory cell C3 is charged with the weak program allowable voltage, the threshold voltage of the memory cell C3 may slightly increase in response to the program voltage. Accordingly, as the bit line is charged with the weak program allowable voltage, which is higher than the program allowable voltage, the width of the first program state P1 may be prevented from increasing due to an excessive increase in the threshold voltage of the memory cell C3.

Figure 4:
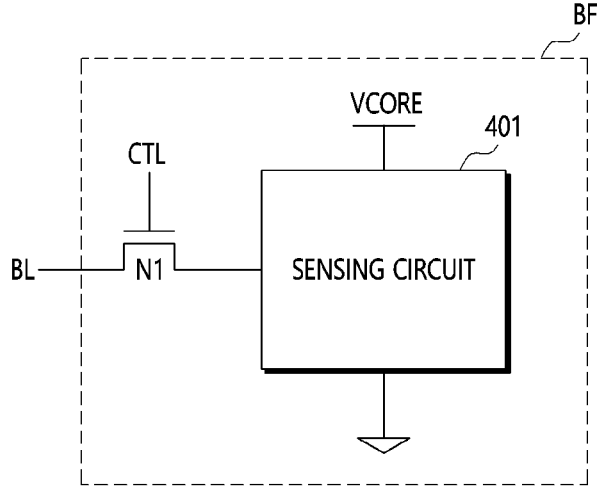
FIG. 4 is a circuit diagram illustrating a bit line control circuit, according to an embodiment of the present technology.

FIG. 4 is a circuit diagram illustrating a bit line control circuit BF, according to an embodiment of the present technology. Each of the bit line control circuits BF1 to BFm of FIG. 1 may be configured and may operate substantially the same as the bit line control circuit BF. A bit line BL of FIG. 4 may be a bit line connected to each of the bit line control circuits BF1 to BFm, among the bit lines BL1 to BLm.

Referring to FIG. 4, the bit line control circuit BF may be connected to the bit line BL. The bit line control circuit BF may sense a voltage level of the bit line BL, which is changed when memory cells are turned on or off, and may determine states of the memory cells connected to the bit line BL according to the sensing result. The bit line control circuit BF may include a control transistor N1 and a sensing circuit 401.

The control transistor N1 may be connected between the bit line BL and the sensing circuit 401. The control transistor N1 may be, for example, an NMOS transistor. The control transistor N1 may be controlled by a control signal CTL. The control signal CTL may be generated by the control signal generation circuit 700 of FIG. 1. The control signal CTL may be applied to a gate of the control transistor N1. When the control signal CTL is applied at a voltage level higher than a threshold voltage of the control transistor N1, the control transistor N1 may be turned on and may be connected to the bit line BL and the sensing circuit 401.

When the control transistor N1 is turned on, the bit line BL may be charged by using a voltage transferred from the sensing circuit 401. In this case, the voltage level of the bit line BL may be determined according to the voltage level of the control signal CTL. Specifically, as the level of the control signal CTL increases at a constant temperature, the bit line BL may be charged to a high voltage level.

The sensing circuit 401 may be connected to the control transistor N1. An internal voltage VCORE and a ground voltage may be supplied to the sensing circuit 401. The sensing circuit 401 may transfer the internal voltage VCORE to the control transistor N1 to charge the bit line BL. When the sensing circuit 401 is connected to the bit line BL through the control transistor N1, the sensing circuit 401 may sense a voltage formed on the bit line BL and may store a value corresponding to the sensed voltage. The value corresponding to the sensed voltage may represent the states of the memory cells connected to the bit line BL.

According to an embodiment, a connection circuit (not illustrated) for connecting the control transistor N1 with the bit line BL may be further included between the control transistor N1 and the bit line BL.

Figure 5:
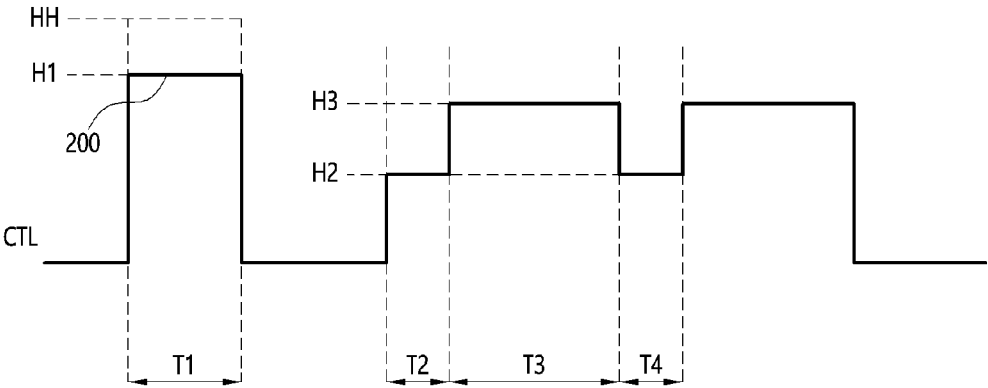
FIG. 5 is a timing diagram illustrating a control signal of FIG. 4, which is generated in any one program loop.

FIG. 5 is a timing diagram illustrating the control signal CTL of FIG. 4, which is generated in any one program loop. Referring to the timing diagram of FIG. 5, all operation periods of any one program loop might not be described, and only first to fourth operation periods T1 to T4 in which temperature characteristics need to be considered may be described. Any one program loop may further include operation periods other than the first to fourth operation periods T1 to T4. The heights of first to third levels H1 to H3, illustrated in FIG. 5, may be in a state in which the temperature characteristics are not considered.

In the first operation period T1, an operation for charging the bit line BL with a weak program allowable voltage may be performed. Specifically, when the bit line BL is connected to a weak program allowable memory cell, the control signal CTL may be applied at a first level H1. The first level H1 may be lower than a level HH, which is the level at which the control signal CTL is applied when a program inhibited voltage, that is, the internal voltage VCORE, charges the bit line BL.

The control transistor N1 may be turned on in response to the control signal CTL having the first level H1. Accordingly, the sensing circuit 401 may be connected to the bit line BL through the control transistor N1 and may transfer the internal voltage VCORE to the control transistor N1 to charge the bit line BL. In this case, since the voltage level of the control signal CTL is applied at the first level H1, which is lower than the level HH, the bit line BL may be charged with the weak program allowable voltage, which is lower than the internal voltage VCORE.

Between the first operation period T1 and the second operation period T2, the control signal CTL may be applied at a low level, and a program voltage may be applied to a selected word line.

Subsequently, before an operation for sensing the state of the bit line BL is performed in the third operation period T3, an operation for weakly charging the bit line BL may be performed in the second operation period T2, and an operation for charging the bit line BL more strongly than in the second operation period T2 may be performed in the third operation period T3.

For example, the control signal CTL may be applied at a second level H2 in the second operation period T2. The control transistor N1 may be turned on in response to the control signal CTL having the second level H2. In addition, a third level H3, which is higher than the second level H2, may be applied in the third operation period T3. The control transistor N1 may be turned on in response to the control signal CTL having the third level H3. Accordingly, the sensing circuit 401 may be connected to the bit line BL through the control transistor N1 and may transfer the internal voltage VCORE to the control transistor N1 to charge the bit line BL. Meanwhile, in the second operation period T2, the verification voltage to be applied to the selected word line may be generated. Therefore, in order to prevent a peak current of the memory device 100 from excessively increasing in the second operation period T2, the control signal CTL may be applied at the second level H2.

In the third operation period T3, after the voltage level of the charged bit line BL is stabilized, the sensing circuit 401 may sense the changed voltage level of the bit line BL in response to the verification voltage applied to the selected word line and may store a value corresponding to the sensed voltage level therein.

For additionally sensing the state of the bit line BL by applying an additional verification voltage, for example, the double verification voltage DPV1, to the selected word line, an operation for recharging the bit line BL may be performed in the fourth operation period T4. For example, the control signal CTL may be applied at the second level H2. The control transistor N1 may be turned on in response to the control signal CTL having the second level H2. Accordingly, the sensing circuit 401 may be connected to the bit line BL through the control transistor N1 and may transfer the internal voltage VCORE to the control transistor N1 to charge the bit line BL. In this case, in order to prevent an overshoot voltage from being applied to the bit line BL, the control signal CTL at the second level H2 may be applied. After the fourth operation period T4, an operation similar to the operation performed in the third operation period T3 may be performed.

Meanwhile, the heights of the first to third levels H1 to H3 of FIG. 5 may be in a state in which the temperature characteristics are not considered, and as will be described later, when various temperature characteristics are reflected, at a predetermined temperature, the heights of the first to third levels H1 to H3 may be different from those illustrated in FIG. 5. For example, the second level H2 may be higher than the third level H3 at a predetermined temperature, which is different from the embodiment illustrated in FIG. 5.

Figure 6:
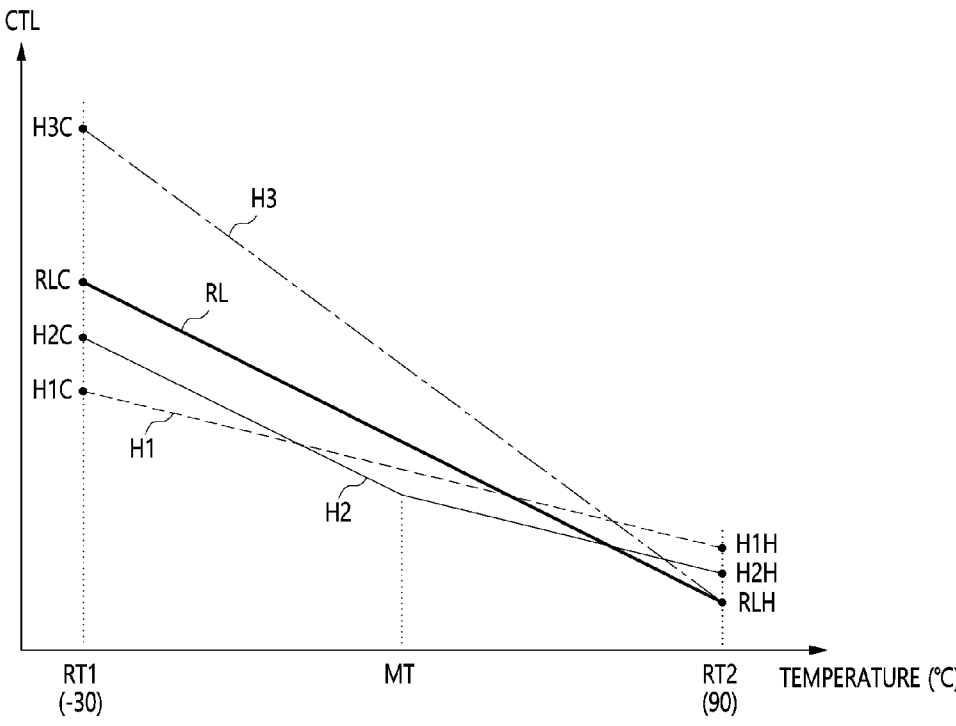
FIG. 6 is a graph illustrating a voltage level of a control signal determined depending on temperatures and operation periods, according to an embodiment of the present technology.

FIG. 6 is a graph illustrating the voltage level of the control signal CTL determined based on temperatures and operation periods, according to an embodiment of the present technology. Each of the first to third levels H1 to H3 of the control signal CTL of FIG. 5 may be determined according to a temperature. Meanwhile, the graph illustrates the level of the control signal CTL within a range from a first reference temperature RT1 to a second reference temperature RT2. In an embodiment, the first reference temperature RT1 and the second reference temperature RT2 may be −30° C. and 90° C., respectively.

Referring to FIG. 6, a reference level RL may be the voltage level of the control signal CTL in which threshold voltage characteristics of the control transistor N1 with respect to temperatures are compensated. The reference level RL may be the voltage level of the control signal CTL at which the bit line BL may be charged to the same voltage level regardless of temperature.

Describing the threshold voltage characteristics of the control transistor N1 with respect to temperatures, the threshold voltage of the control transistor N1 may become higher at a lower temperature. Accordingly, the control signal CTL may be applied at a higher level at a lower temperature so that the bit line BL is charged to a constant voltage level regardless of temperature. Consequently, the reference level RL may have negative variations in temperature.

According to the characteristics of the first to fourth operation periods T1 to T4 of FIG. 5, the first to third levels H1 to H3 of the control signal CTL may be determined by reflecting the different temperature characteristics in the reference level RL.

The first level H1 may be the level of the control signal CTL in the first operation period T1, and a method of determining the first level H1 according to temperatures is as follows. Specifically, at the second reference temperature RT2, the first level H1 of the control signal CTL may be a level H1H, which is higher than a voltage level RLH of the reference level RL so that the bit line BL is charged with a weak program allowable voltage. However, due to program characteristics of memory cells with respect to temperatures, the memory cells may be programmed more strongly at a higher temperature in response to the program voltage, that is, the threshold voltage may increase more highly. In other words, the memory cells may be more weakly programmed at a lower temperature in response to the program voltage, and thus, the bit line BL needs to be charged to a lower voltage level at a lower temperature. Consequently, at the first reference temperature RT1, the first level H1 of the control signal CTL may be a level H1C, which is lower than a voltage level RLC of the reference level RL. Accordingly, at the first reference temperature RT1, the bit line BL may be charged to a voltage level that is lower than the voltage level charged at the second reference temperature RT2. Variations in temperature of the first level H1, that is, an absolute value of a slope of the graph, may be less than variations in temperature of the reference level RL.

The second level H2 may be the level of the control signal CTL in the second operation period T2, and a method of determining the second level H2 according to temperatures is as follows. Specifically, due to circuit characteristics of the memory device 100, a current (hereinafter referred to as a first current) related to charging the bit line BL in the second operation period T2 may increase as the temperature decreases, and a current (hereinafter referred to as a second current) related to applying the verification voltage to word lines may increase as the temperature increases. Since the first current and the second current occur simultaneously in the second operation period T2, the first current and the second current may appear as a peak current of the memory device 100, and this peak current may have a maximum value at a specific maximum peak current temperature MT. Accordingly, considering peak current characteristics with respect to temperatures, the bit line BL needs to be weakly charged at a temperature that is lower than the maximum peak current temperature MT. However, weakly charging the bit line BL in the second operation period T2 eventually delays time, for example, bit line settling time, at which the voltage level of the bit line BL is stabilized in the third operation period T3, and therefore, the bit line BL needs to be charged as quickly as possible while suppressing the peak current in the second operation period T2.

Consequently, the second level H2 of the control signal CTL may have a form in which the variations in temperature vary at the maximum peak current temperature MT in consideration of the peak current characteristics with respect to temperatures and the bit line settling time. At a temperature lower than the maximum peak current temperature MT, the variations in temperature of the second level H2 may be the same as the variations in temperature of the reference level RL. At a temperature higher than the maximum peak current temperature MT, the variations in temperature of the second level H2 may be the same as the variations in temperature of the first level H1. At the first reference temperature RT1, the second level H2 may be a level H2C, which is lower than the voltage level RLC of the reference level RL and higher than the voltage level H1C of the first level H1. At the second reference temperature RT2, the second level H2 may be a level H2H, which is higher than the voltage level RLH of the reference level RL and lower than the voltage level H1H of the first level H1.

The third level H3 may be the level of the control signal CTL in the third operation period T3, and a method of determining the third level H3 according to temperatures is as follows. The third level H3 may be a level obtained by further compensating for the current characteristics of the memory cells with respect to temperatures at the reference level RL in which the threshold voltage characteristics of the control transistor N1 with respect to temperatures are compensated. Describing the current characteristics of the memory cells with respect to temperatures, the memory cells may allow less current to flow at a lower temperature. Accordingly, the bit line BL needs to be charged to a higher voltage level at a lower temperature so that the memory cells may allow a constant current to flow regardless of temperatures in response to the verification voltage in the third operation period T3. Accordingly, the control signal CTL may be applied at a higher level at a lower temperature so that the bit line BL is charged to a higher voltage level at a lower temperature. Consequently, the third level H3 of the control signal CTL in which the threshold voltage characteristics of the control transistor N1 and the current characteristics of the memory cells with respect to temperatures are compensated together may have greater negative variations in temperature than the reference level RL. In other words, the variations in temperature of the third level H3 may be greater than the variations in temperature of the reference level RL. At the first reference temperature RT1, the third level H3 may be a level H3C, which is higher than the voltage level RLC of the reference level RL. In addition, at the second reference temperature RT2, the third level H3 may be the same level as the voltage level RLH of the reference level RL.

The fourth operation period T4 may be an operation period in which the bit line settling time needs to also be taken into account while preventing the overshoot voltage from being applied to the bit line BL. An idea considering the bit line settling time while suppressing the peak current in the second operation period T2 may be similarly applied to the fourth operation period T4. Accordingly, in the fourth operation period T4, the control signal CTL may be determined to have the second level H2 according to temperatures.

Figure 7:
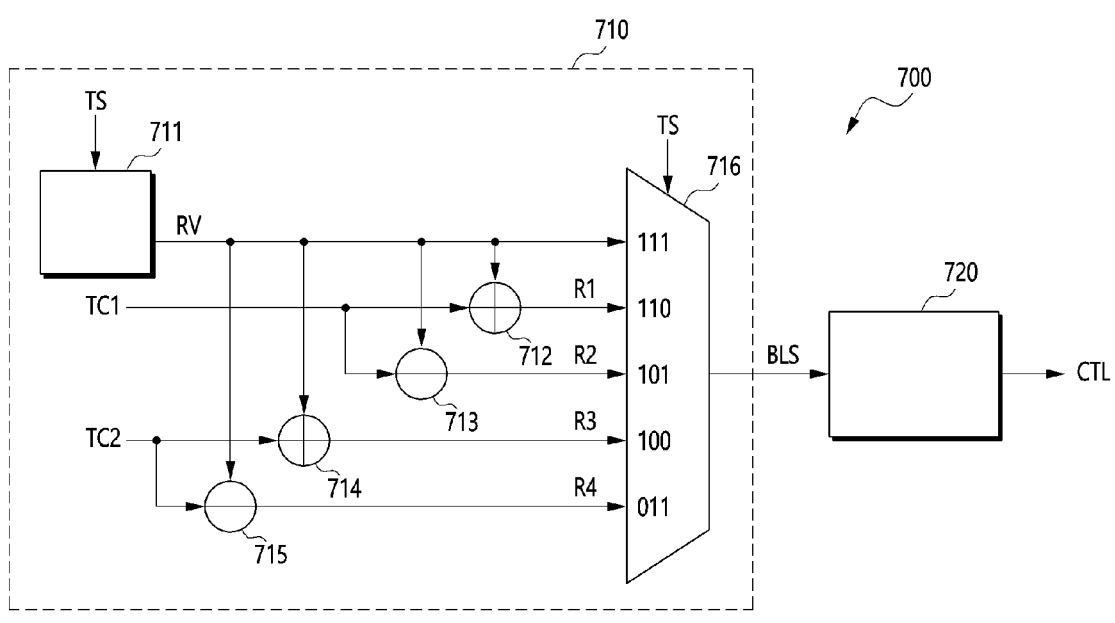
FIG. 7 is a block diagram specifically illustrating a control signal generation circuit of FIG. 1, according to an embodiment of the present technology.

FIG. 7 is a block diagram specifically illustrating the control signal generation circuit 700 of FIG. 1, according to an embodiment of the present technology.

Referring to FIG. 7, the control signal generation circuit 700 may include a bit line voltage determination circuit 710 and a control signal output circuit 720.

The bit line voltage determination circuit 710 may generate a bit line level signal BLS according to temperatures in the first to fourth operation periods T1 to T4 of the program operation. The bit line level signal BLS may correspond to a voltage level at which the bit line BL is to be charged. The bit line voltage determination circuit 710 may generate the bit line level signal BLS in consideration of the program characteristics and current characteristics of the memory cells with respect to temperatures, the peak current characteristics, and the bit line settling time described above with reference to FIG. 6.

The bit line voltage determination circuit 710 may generate the bit line level signal BLS based on an operation period signal TS, a reference value RV, a first temperature compensation value TC1, and a second temperature compensation value TC2. Specifically, the bit line voltage determination circuit 710 may calculate the reference value RV, the first temperature compensation value TC1, and the second temperature compensation value TC2 and may output the bit line level signal BLS in response to the operation period signal TS. More specifically, the bit line voltage determination circuit 710 may generate first to fourth result values R1 to R4 by calculating the reference value RV, the first temperature compensation value TC1, and the second temperature compensation value TC2 and may output any one of the reference value RV and the first to fourth result values R1 to R4 as the bit line level signal BLS in response to the operation period signal TS.

The operation period signal TS may represent the first to fourth operation periods T1 to T4 during the program operation. Table TB of FIG. 7 represents the exemplary operation period signal TS, which is input in each of the first to fourth operation periods T1 to T4, and the first to third levels H1 to H3 of the control signal CTL, which is generated in each of the first to fourth operation periods T1 to T4. Meanwhile, when the operation period signal TS is 111, the control signal CTL may be generated at the reference level RL. In addition, although 100 is not used as the operation period signal TS, 100 may also be used as the operation period signal TS to reflect other temperature characteristics according to embodiments. The operation period signal TS may be generated by the control circuit 121 of FIG. 1.

The reference value RV may be a constant value regardless of temperatures in each of the first to fourth operation periods T1 to T4. However, the reference value RV may be generated differently in the first to fourth operation periods T1 to T4. According to an embodiment, the reference value RV may be a constant value in the first to fourth operation periods T1 to T4.

The first temperature compensation value TC1, which is a value to be calculated, that is, to be added or subtracted, from the reference value RV according to the current temperature, may have constant negative variations in temperature. For example, the first temperature compensation value TC1 may decrease as the temperature increases between the first reference temperature RT1 and the second reference temperature RT2. The first temperature compensation value TC1 may reflect the program characteristics and current characteristics of the memory cells with respect to temperatures. The first temperature compensation value TC1 may be generated by the control circuit 121 of FIG. 1.

The second temperature compensation value TC2, which is a value to be calculated, that is, to be added or subtracted, from the reference value RV according to the current temperature, may be a constant value at a temperature lower than the maximum peak current temperature MT. In addition, the second temperature compensation value TC2 may have constant negative variations in temperature at a temperature higher than the maximum peak current temperature MT. The second temperature compensation value TC2 may reflect the peak current characteristics with respect to temperatures and the bit line settling time. The second temperature compensation value TC2 may be generated by the control circuit 121 of FIG. 1.

The bit line voltage determination circuit 710 may include a reference value output circuit 711, a first adder 712, a first subtractor 713, a second adder 714, a second subtractor 715, and a selection circuit 716. The reference value output circuit 711 may output the reference value RV in response to the operation period signal TS. The first adder 712 may add the reference value RV and the first temperature compensation value TC1 and may output the first result value R1. The first subtractor 713 may subtract the first temperature compensation value TC1 from the reference value RV and may output the second result value R2. The second adder 714 may add the reference value RV and the second temperature compensation value TC2 and may output the third result value R3. The second subtractor 715 may subtract the second temperature compensation value TC2 from the reference value RV and may output the fourth result value R4. The selection circuit 716 may output, as the bit line level signal BLS, any one of the reference value RV and the first to fourth result values R1 to R4 corresponding to the operation period signal TS in response to the operation period signal TS.

The control signal output circuit 720 may output the control signal CTL based on the bit line level signal BLS. Specifically, the control signal output circuit 720 may generate the control signal CTL by further reflecting the threshold voltage characteristics of the control transistor N1 with respect to temperatures, from the bit line level signal BLS generated by reflecting the program characteristics and current characteristics of the memory cells with respect to temperatures, the peak current characteristics, and the bit line settling time. For example, the control signal output circuit 720 may determine the first voltage level based on the bit line level signal BLS and may output the control signal CTL at the second voltage level obtained by adding the third temperature compensation value to the first voltage level. Herein, the first voltage level may be the voltage level of the control signal CTL capable of charging the bit line BL to a voltage level corresponding to the bit line level signal BLS. The third temperature compensation value may have negative variations in temperature. The third temperature compensation value may correspond to the reference level RL of FIG. 6.

FIGS. 8A to 8D are tables exemplarily illustrating the bit line level signal BLS and the reference level RL and first to third levels H1 to H3 of the control signal CTL generated based on the reference value RV, the first temperature compensation value TC1, and the second temperature compensation value TC2 corresponding to the current temperature in the control signal generation circuit 700 of FIG. 7.

Referring to FIG. 8A, when the operation period signal TS is input as 111, the constant reference value RV, regardless of temperature, may be generated as the bit line level signal BLS by the bit line voltage determination circuit 710. In addition, the control signal output circuit 720 may be the reference level RL of the control signal CTL by reflecting the threshold voltage characteristics of the control transistor N1 with respect to temperatures in the bit line level signal BLS.

Referring to FIG. 8B, when the operation period signal TS is input as 101 in the first operation period T1, the bit line voltage determination circuit 710 may output the bit line level signal BLS by subtracting the first temperature compensation value TC1 from the constant reference value RV. In addition, the control signal output circuit 720 may output the first level H1 of the control signal CTL by reflecting the threshold voltage characteristics of the control transistor N1 with respect to temperatures in the bit line level signal BLS.

Referring to FIG. 8C, when the operation period signal TS is input as 011 in the second and fourth operation periods T2 and T4, the bit line voltage determination circuit 710 may output the bit line level signal BLS by subtracting the second temperature compensation value TC2 from the constant reference value RV. In addition, the control signal output circuit 720 may output the second level H2 of the control signal CTL by reflecting the threshold voltage characteristics of the control transistor N1 with respect to temperatures in the bit line level signal BLS.

Referring to FIG. 8D, when the operation period signal TS is input as 110 in the third operation period T3, the bit line level signal BLS may be output by adding the constant reference value RV and the first temperature compensation value TC1 by the bit line voltage determination circuit 710. In addition, the control signal output circuit 720 may output the third level H3 of the control signal CTL by reflecting the threshold voltage characteristics of the control transistor N1 with respect to temperatures in the bit line level signal BLS.

Although an exemplary embodiment of the present technology has been described for illustrative purposes, those skilled in the art will appreciate that various modifications and changes are possible, without departing from the essential features of the technology. Accordingly, the exemplary embodiments disclosed in the present technology are not intended to limit but illustrate the technical spirit of the present technology, and the scope of the technical spirit of the present technology is not limited by the exemplary embodiments. The protection scope of the present technology should be construed based on the following appended claims and it should be interpreted that all the technical spirit included within the scope identical or equivalent to the claims belongs to the scope of the present technology.

What is claimed is:

1. A memory device comprising:
   a control signal generation circuit configured to generate a control signal at a voltage level corresponding to a current temperature in each operation period, among a plurality of operation periods, of a program operation; and
   a bit line control circuit configured to charge a bit line in response to the control signal,
   wherein the voltage level is variable in accordance with the current temperature.

2. The memory device according to claim 1, wherein the control signal generation circuit generates the control signal at a first level in a first operation period, among the plurality of operation periods,
   wherein the first level is lower than a reference level having negative variations in temperature at a first reference temperature and higher than the reference level at a second reference temperature, which is higher than the first reference temperature, and
   wherein the reference level is a voltage level of the control signal for charging the bit line at a constant voltage level regardless of the current temperature.

3. The memory device according to claim 2, wherein the first operation period includes a period in which the bit line is charged with a weak program allowable voltage before a program voltage is applied to a word line.

4. The memory device according to claim 1, wherein the control signal generation circuit generates the control signal at a second level in a second operation period, among the plurality of operation periods,
   wherein the second level is lower than a reference level having negative variations in temperature at a first reference temperature and higher than the reference level at a second reference temperature, which is higher than the first reference temperature,
   wherein variations in temperature of the second level at a temperature lower than a maximum peak current temperature are greater than variations in temperature of the second level at a temperature higher than the maximum peak current temperature, and wherein the reference level is a voltage level of the control signal for charging the bit line to a constant voltage level regardless of the current temperature.

5. The memory device according to claim 4, wherein variations in temperature of the second level are equal to variations in temperature of the reference level at the temperature lower than the maximum peak current temperature.

6. The memory device according to claim 4, wherein the second operation period includes a period in which the bit line is weakly charged before a state of the bit line is sensed.

7. The memory device according to claim 4, wherein the control signal generation circuit generates the control signal at the second level in a fourth operation period, among the plurality of operation periods, and wherein the fourth operation period includes a period in which the bit line is weakly charged before a state of the bit line is additionally sensed based on an additional verification voltage.

8. The memory device according to claim 1, wherein the control signal generation circuit generates the control signal at a third level in a third operation period, among the plurality of operation periods, wherein the third level is higher than a reference level having negative variations in temperature at a first reference temperature and equal to the reference level at a second reference temperature, which is higher than the first reference temperature, and wherein the reference level is a voltage level of the control signal for charging the bit line to a constant voltage level regardless of the current temperature.

9. The memory device according to claim 8, wherein the third operation period includes a period in which the bit line is strongly charged and then a state of the bit line, which is changed based on a state of a memory cell in response to a verification voltage, is sensed.

10. A memory device comprising:

a control signal generation circuit configured to generate a bit line level signal, which corresponds to a voltage level of a bit line, based on first and second temperature compensation values in response to an operation period signal and configured to generate a control signal based on the bit line level signal and a third temperature compensation value; and a bit line control circuit configured to charge the bit line in response to the control signal.

11. The memory device according to claim 10, wherein the control signal generation circuit generates a value as the bit line level signal by subtracting the first temperature compensation value from a reference value in response to the operation period signal corresponding to a first operation period of a program operation.

12. The memory device according to claim 11, wherein the first operation period includes a period in which the bit line is charged with a weak program allowable voltage before a program voltage is applied to a word line.

13. The memory device according to claim 10, wherein the control signal generation circuit generates a value as the bit line level signal by subtracting the second temperature compensation value from a reference value in response to the operation period signal corresponding to a second operation period of a program operation.

14. The memory device according to claim 13, wherein the second operation period includes a period in which the bit line is weakly charged before a state of the bit line is sensed.

15. The memory device according to claim 13, wherein the operation period signal is the same as the operation period signal corresponding to the second operation period in a fourth operation period of the program operation, and wherein the fourth operation period includes a period in which the bit line is weakly charged before a state of the bit line is additionally sensed based on an additional verification voltage.

16. The memory device according to claim 10, wherein the control signal generation circuit determines a first voltage level based on the bit line level signal and outputs the control signal at a second voltage level obtained by adding the third temperature compensation value to the first voltage level, and wherein the first voltage level is a voltage level of the control signal capable of charging the bit line to a voltage level corresponding to the bit line level signal.

17. The memory device according to claim 10, wherein the first temperature compensation value is determined based on program characteristics and current characteristics of memory cells with respect to temperatures.

18. The memory device according to claim 10, wherein the first temperature compensation value has negative variations in temperature.

19. The memory device according to claim 10, wherein the second temperature compensation value is determined based on peak current characteristics with respect to temperatures and bit line settling time.

20. The memory device according to claim 10, wherein the second temperature compensation value is a constant value at a temperature lower than a maximum peak current temperature and has negative variations in temperature at a temperature higher than the maximum peak current temperature.

21. The memory device according to claim 10, wherein the bit line control circuit includes a control transistor configured to transfer a voltage for charging the bit line to the bit line in response to the control signal, and wherein the third temperature compensation value is determined based on threshold voltage characteristics with respect to temperatures of the control transistor.

22. The memory device according to claim 10, wherein the third temperature compensation value has negative variations in temperature.

23. A memory device comprising:

a control signal generation circuit configured to generate a control signal in a period in which a bit line is charged before a state of the bit line is sensed during a program operation, wherein variations in temperature of a level of the control signal at a temperature lower than a maximum peak current temperature are greater than variations in temperature of the level of the control signal at a temperature higher than the maximum peak current temperature; and a bit line control circuit configured to charge the bit line in response to the control signal.

*    *    *    *    *